US006521846B1

(12) United States Patent
Freda et al.

(10) Patent No.: US 6,521,846 B1
(45) Date of Patent: Feb. 18, 2003

(54) METHOD FOR ASSIGNING POWER AND GROUND PINS IN ARRAY PACKAGES TO ENHANCE NEXT LEVEL ROUTING

(75) Inventors: Michael C. Freda, Morgan Hill, CA (US); Prabhansu Chakrabarti, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/041,019

(22) Filed: Jan. 7, 2002

(51) Int. Cl.$^7$ .................................................. H05K 1/16
(52) U.S. Cl. ........................ 174/260; 29/884; 257/691; 257/698; 361/761
(58) Field of Search ........................ 174/260; 257/691, 257/700, 698; 29/830, 884; 361/761, 760; 438/128

(56) References Cited

U.S. PATENT DOCUMENTS

| 4,706,162 A | * | 11/1987 | Hernandez et al. ...... 361/306.2 |
| 5,717,245 A | * | 2/1998 | Pedder ........................ 257/691 |
| 5,832,596 A | * | 11/1998 | Chiu ............................ 29/830 |
| 6,160,705 A | * | 12/2000 | Stearns et al. ............... 361/761 |
| 6,396,728 B1 | | 5/2002 | Abedifard et al. |
| 6,426,550 B2 | | 7/2002 | Ball et al. |
| 6,429,530 B1 | | 8/2002 | Chen |

* cited by examiner

Primary Examiner—Albert W. Paladini
(74) Attorney, Agent, or Firm—Meyertons Hood Kivlin Kowert & Goetzel, P.C.; B. Noël Kivlin (57) ABSTRACT

A method for assigning power and ground pins in array packages in order to enhance next level routing is provided. In one embodiment, the method comprises arranging connections of a semiconductor array package, the semiconductor package having an integrated circuit with power, ground, and signal connections, in 2×3 connection grids. Each connection grid includes a power connection and a ground connection which is adjacent to the power connection. The 2×3 connection grids are arranged so that each connection at the periphery is a signal connection. A 4:1:1 signal:power:ground connection ratio is maintained in the arrangement, wherein no more than four signal connections are present for each power connection, and no more than four signal connections are present for each ground connection.

27 Claims, 10 Drawing Sheets

Signal Layer 1 Escape

Signal Layer 2 Escape

Fig. 3D

Signal Layer 3 Escape

Fig. 3E

Signal Layer 4 Escape

Fig. 3F

Signal Layer 5 Escape

METHOD FOR ASSIGNING POWER AND GROUND PINS IN ARRAY PACKAGES TO ENHANCE NEXT LEVEL ROUTING

BACKGROUND OF THE INVENTION

1. Field of the Invention

This invention relates to electronic packaging, and more particularly, to pin assignments for semiconductor chip packages.

2. Description of the Related Art

Levels of integration for semiconductor chips continue to increase. As a result of these increasing levels of integration, pin counts for semi-conductor packages continue to increase as well. Part of this increase is due to the additional signal connections that may be required. As the number of signal connections, and thus signal pins increases, the number of required power and ground pins on a semiconductor package increases as well. Power and ground pins may be necessary to ensure the integrity of signal passing through the signal pins of a semiconductor package. Power and ground pins may aid in providing low inductance current loops for signals. Power and ground pins may also aid in providing a relatively noise free return path for each signal.

In designing the packaging for a semiconductor chip, the total number of pins of may be determined by both the number of required signal connections, and a signal:power::ground ratio defined by a signal integrity engineer. This ratio is the number of signal pins to the number of power pins and number of ground pins. Thus, after determining the number of required signal pins, the minimum number of pins required for the semiconductor package may be determined using this ratio. Once the number of pins to be used by the semiconductor package has been determined, pin assignments may then be made. Typically, it is desirable to spread the power and ground pins equally throughout the distribution of pins.

One important factor that is typically not considered in the designing of the packaging for semiconductor chips is the routing of the signal paths for signal pins. Semiconductor packages are usually mounted to printed circuit boards (PCBs) or other type of carrier. The carrier may have multiple signal layers, and signal paths may be routed to these pins through these signal layers and vias, which pass through the signal layers to the pin of the semiconductor package. In some cases, the pin assignment may require the use of extra signal layers in order to ensure that paths (sometimes referred to as escape paths) are available for routing signal lines to the pins from other areas of the carrier.

The routing of signal lines may be further complicated by a small interconnect pitch that is required for many semiconductor packages (pitch is the distance between centers of signal pins). For example, for a PCB configured for the mounting of 1.27 mm (50 mil) pitch packages, 2 to 3 signal lines may be routed between interconnects on a single layer. On a PCB configured for the mounting of 1.0 mm (39 mil) packages, only 1–2 signal lines may be routed between interconnects on a single layer. Thus, as pitch decreases, it becomes more likely that extra signal layers will be required in order to provide escape paths for the routing of signal lines.

Extra signal layers may impose additional costs in the manufacture of PCB's and other types of circuit carriers. Extra layers may result in higher material costs, as well as additional processing costs during manufacture. Furthermore, extra layers may provide more opportunities for defects to occur during manufacture, thereby adding additional costs that were not initially planned for. Extra layers may also lead to reliability issues during the operational life of the PCB. Thus, it is desirable to avoid the use of extra signal layers when routing signal paths to the pins of semiconductor packages.

SUMMARY OF THE INVENTION

A method for assigning power and ground pins in array packages in order to enhance next level routing is provided. In one embodiment, the method comprises arranging connections of a semiconductor array package, the semiconductor package having an integrated circuit with power, ground, and signal connections, in M×N connection grids. In one embodiment, the grids are 2×3 connection grids. Each connection grid includes a power connection and a ground connection which is adjacent to the power connection. The 2×3 connection grids are arranged so that each connection at the periphery of the grid array for the entire package is a signal connection. A 4:1:1 signal:power:ground connection ratio is maintained in the arrangement, wherein no more than four signal connections are present for each power connection, and no more than four signal connections are present for each ground connection. Some no-connects (that is, pins with no electrical connection, or absence of pin in certain cells of the grid) may also be present to enhance signal routing.

The semiconductor package for which the arrangement is conducted may be an array package (e.g. a ball grid array) configured for mounting on a printed circuit board (PCB). A plurality of pads for mounting the semiconductor package may be located on the surface of the PCB. The PCB may also include a plurality of layers, including signal layers, one or more power planes, and one or more ground planes. Apertures in the planes, known as vias, may be used to connect power, ground or signals to the pads located on the PCB surface layer. Signal lines may be routed from pads associated with signal connections either on the surface of the PCB, or through a via to an internal layer. The arrangement of the connections on the semiconductor package may allow for more signal escape paths (i.e. paths for routing signal lines from the pads), which may result in fewer signal layers being necessary to implement the PCB.

Arrangement of the connections of a semiconductor array package by tiling the M×N grids may ensure signal:power:ground ratio is achieved. Following the completion of the tiling, additional signal escape paths may be added by replacing some of the signal connections with no-connects. The method of arranging connections may be implemented manually by laying out the M×N grids. It is further possible and contemplated that the tiling of the M×N grids may be automated.

Thus, in various embodiments, the method for assigning power and ground pins may allow for additional signal routing escape paths. By allowing additional signal routing escape paths, fewer signal layers may be required to implement the PCB to which the semiconductor package is to be mounted. Using fewer signal layers may result in lower material and processing costs in the manufacture of the PCB.

BRIEF DESCRIPTION OF THE DRAWINGS

Other aspects of the invention will become apparent upon reading the following detailed description and upon reference to the accompanying drawings in which:

FIG. 4B is a drawing illustrating another embodiment of a set of PCB design rules; and While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 1:
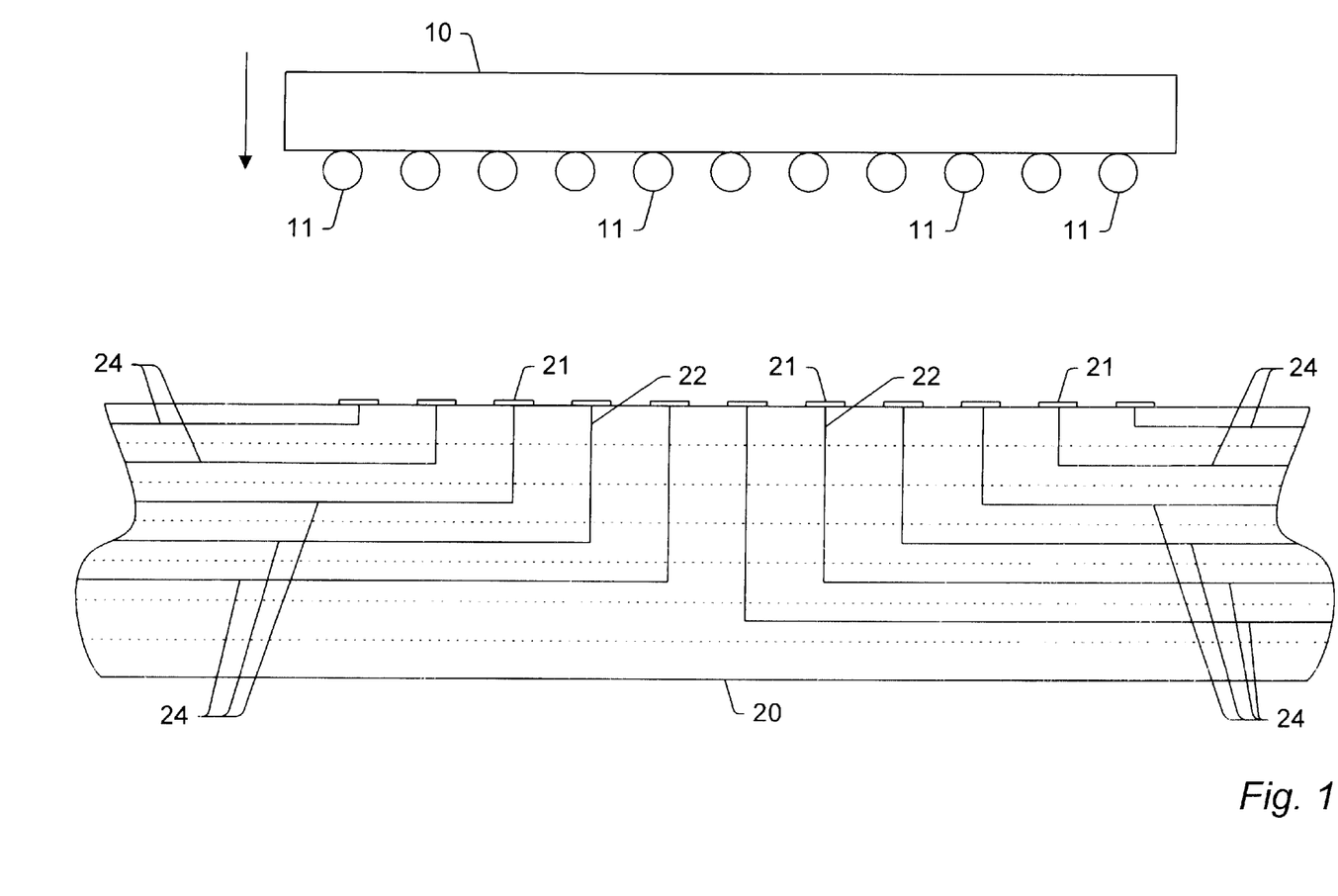
FIG. 1 is an illustration of one embodiment of an exemplary ball-grid array (BGA) semiconductor package and a multi-layer printed circuit board (PCB) to which the BGA may be mounted.

Turning now to FIG. 1, an illustration of one embodiment of an exemplary ballgrid array (BGA) semiconductor package and a multi-layer printed circuit board (PCB) to which the BGA may be mounted is shown. BGA package 10 may be a package for an integrated circuit, and may be configured for mounting on PCB 20. BGA package 10 includes a plurality of solder balls 11, which may be soldered to pads 21 of PCB 20. Each solder ball 11 may be electrically connected to the integrated circuit within BGA package 10, although embodiments are possible and contemplated where some of the solder balls have no electrical connection. Those solder balls having an electrical connection may be a power connection, a ground (or other reference) connection, or may comprise a signal connection.

Other similar types of packaging may be used instead of BGA package 10. For example, an LGA (Land Grid Array) package may be used for packaging of an integrated circuit. An LGA package may have a similar physical configuration to that shown for BGA package 10, but may use elastomeric connections instead of solder balls.

PCB 20 includes a plurality of layers, which are delineated in the drawing by the dashed lines. Some of these layers may be signal layers having one or more signal lines 24 for conveying signals to and from the integrated circuit in BGA package 10. Typically, at least one layer of PCB 20 will comprise a power plane, and another layer will comprise a ground plane. Electrical connections from pads 21 to the power plane, ground plane, or signal lines 24 may be made by vias 22. Vias 22 may pass vertically through one or more layers of PCB 20 in order to make electrical connections from a surface of the PCB to an internal layer or to the other surface. In some embodiments, vias used for power and ground connections may be restricted from being shared with signal routings. Such sharing may be common in other PCB's.

Figure 2:
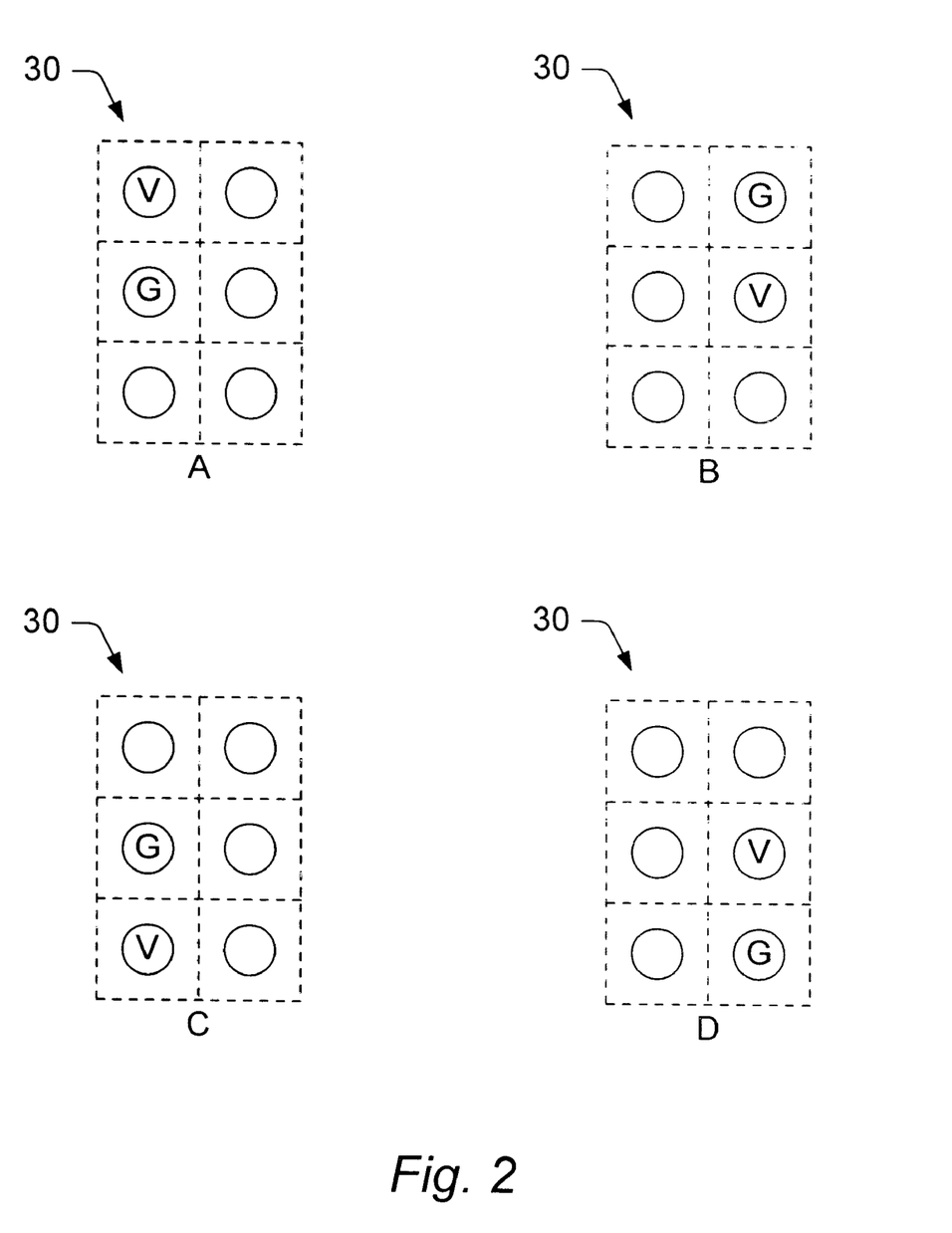
FIG. 2 is an illustration of various embodiments of an M×N connection grid which may be used in conducting pin assignments for a semiconductor package.

FIG. 2 is an illustration of various embodiments of an M×N connection grid which may be used in conducting pin assignments for a semiconductor package, wherein M and N are both integer values. The embodiment shown in this drawing is a 2×3 connection grid, although other grid sizes are possible and contemplated. A method for assigning pins to a semiconductor package may be performed by arranging any of the embodiments A–D shown in the drawing. Multiple embodiments may be used in assigning pins to the same semiconductor package. Furthermore, any of the embodiments may be rotated 90 degrees clockwise or counter-clockwise with respect to other grids in the particular implementation.

Each 2×3 connection grid 30 includes six cells, wherein each cell may represent a space for a solder ball of a BGA package, or a connection of an LGA package. In some embodiments, a cell may represent a space for a pin of a pin-grid array package. Each 2×3 connection grid 30 includes a space for a power plane (designated 'V' in the drawings), and an adjacent space for a ground plane (designated 'G' in the drawings). The four remaining spaces may be used for signal connections, although some of these spaces may be used for physical connections only, or may have no connection. In spaces where no connection exists, physical or electrical, no solder ball will be placed in the corresponding space of the resulting design.

The method for determining the pin assignment of a grid array package comprises arranging a plurality of the 2×3 connection grids to create a plurality of connections. The grids are arranged such that each connection at the periphery of the plurality of connections (i.e. the grid array as a whole) is a signal connection. This may help minimize the number of additional layers required by a PCB to which the package is to be mounted by allowing for more escape paths for signal routing. The arranging of the 2×3 connections grids may be accomplished by manually "tiling" a plurality of the 2×3 connection grids (or M×N grids in the general case). It is further possible and contemplated that the method may be automated and implemented using a computer system with automated software.

Since each grid may include a maximum of four signal connections for each power connection and each ground connection, a 4:1:1 signal-to-power-to-ground ratio may be maintained during the design. Such a ratio may be useful for ensuring good signal integrity for many package designs. As previously noted, the signal-to-power-ground ratio may actually be less than 4:1:1 in many cases due to the use of no-connects for some pin assignments.

Figure 3A:
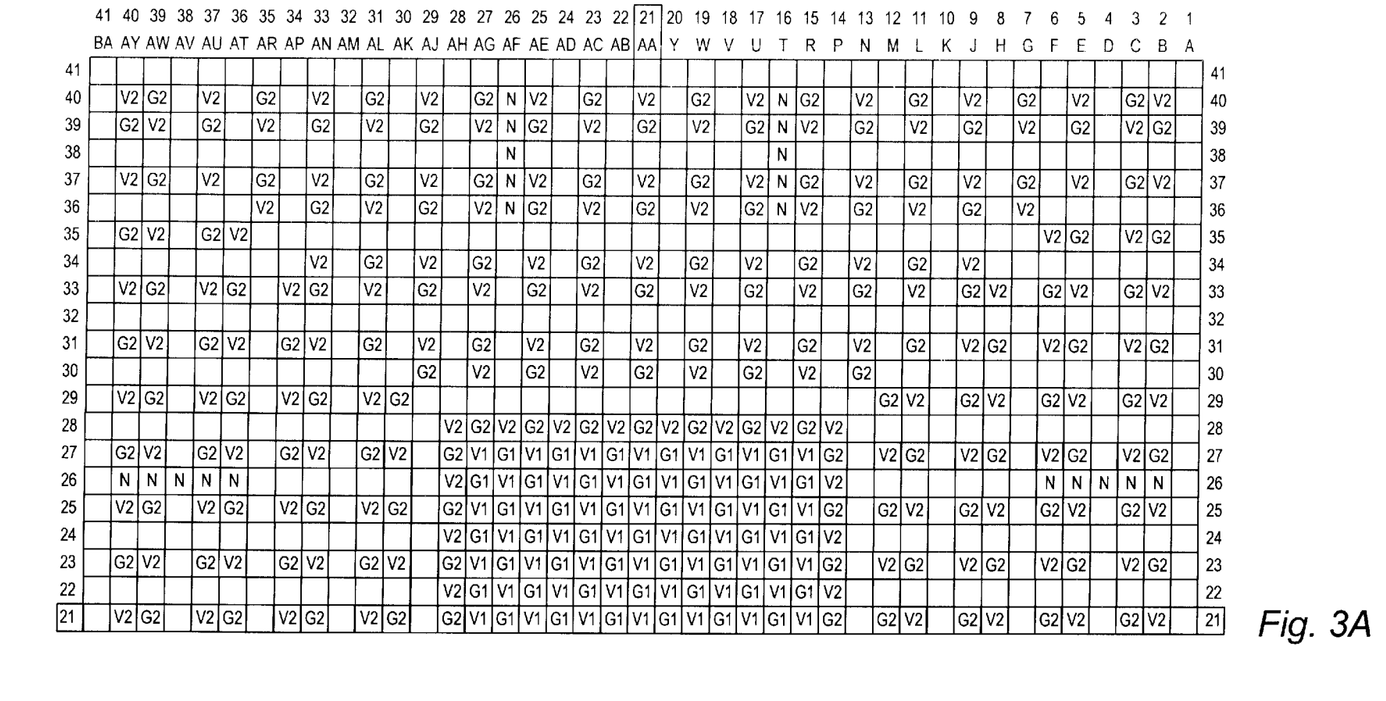
FIG. 3A is an illustration of one embodiment of a pin assignment for a grid array semiconductor package.

FIGS. 3A–3F are illustrations of a of one embodiment of signal pin assignments for a semiconductor package based on a plurality 2×3 connection grids to allow escape paths for the routing of signal lines on various PCB layers. The pin assignment for the embodiment shown was performed using the 2×3 connections grids described in reference to FIG. 2. FIG. 3A illustrates the pin assignment for the array package, which is a 41×41 pin package in this embodiment. The area near the center of the package is comprised of power connections and ground connections for core power, which is the power provided to the internal logic of the integrated circuit. Core power and ground connections are designated here as V1 and G1, respectively. The remainder of the power and ground connections, designated V2 and G2 respectively, are dedicated to I/O functions, and are comprised by the 2×3 connection grids used for the assignment of pins. Those grid cells designated 'N' are no-connect cells, and thus there is no electrical (and possibly no physical) connection in that particular location. The semiconductor package resulting from the design which includes this pin assignment is configured for mounting on a PCB having multiple layers.

As can be seen in the drawing, pin assignments are made in accordance with the 2×3 connection grid as described in FIG. 2. A plurality of these grids, in various orientations, are used to obtain the final pin assignment. The outermost periphery of the plurality of pins is comprised entirely of signal pins. Overall, a signal:power:ground ratio of 3.8:1.02:1 is achieved for this particular embodiment, which is within the requirement of the 4:1:1 ratio specified for the method.

Figure 3B:
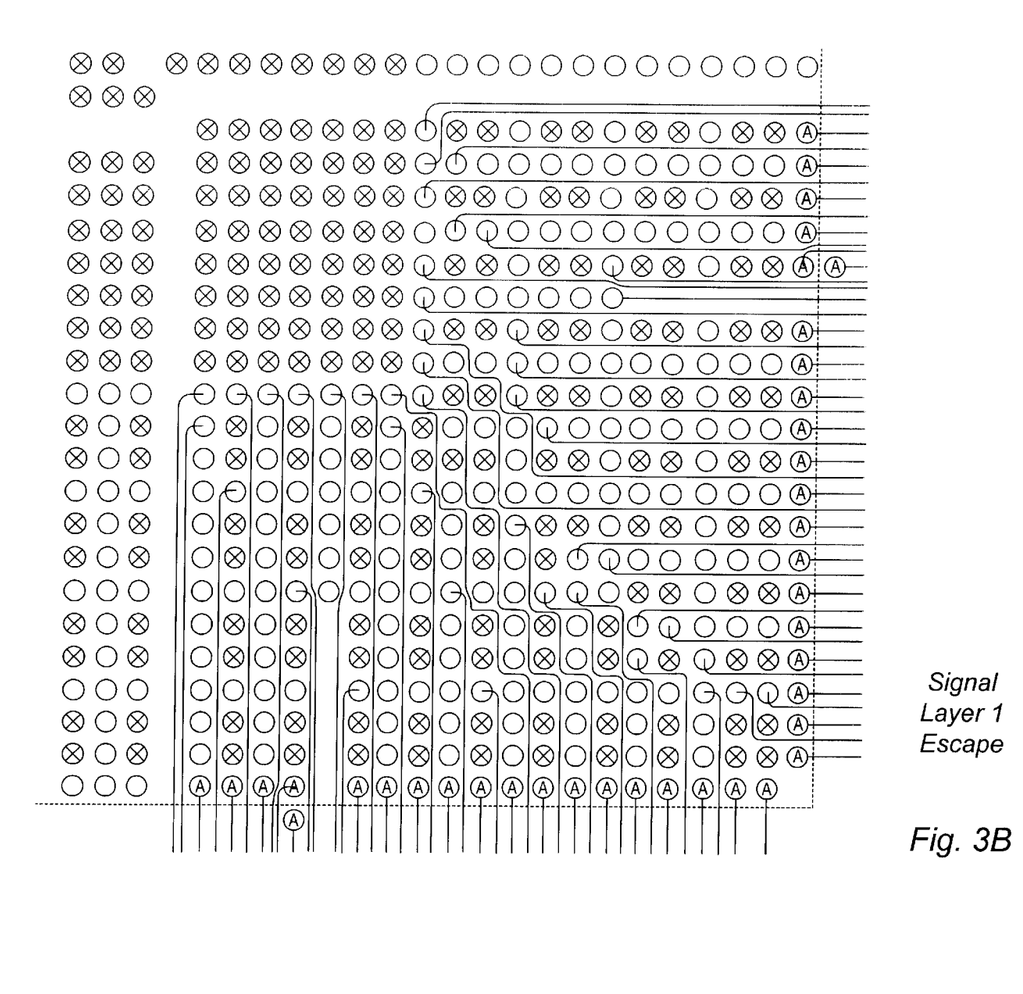
FIG. 3B is an illustration of a portion of one embodiment of signal pin assignments based on a 2×3 grid which illustrates escape paths for the routing of signal lines on a first PCB layer.

Signal escape paths can be seen in FIGS. 3B–3F, each of which illustrates the routing of signal lines for a portion of the package for a particular PCB layer. In FIG. 3B, signal lines are shown in the escape paths for a first PCB layer. As previously noted, signal connections occupy the spaces at the outermost periphery of the plurality of connections. In the drawing, these connections are labeled with the designator 'A', indicating that any layer can be used to route signal lines to these connections. The remainder of the signal lines shown in the drawing are routed to their corresponding connections on a first PCB layer. Also present in the drawing are areas where no connections exist, allowing several signal lines to be routed through these areas.

Figure 3C:
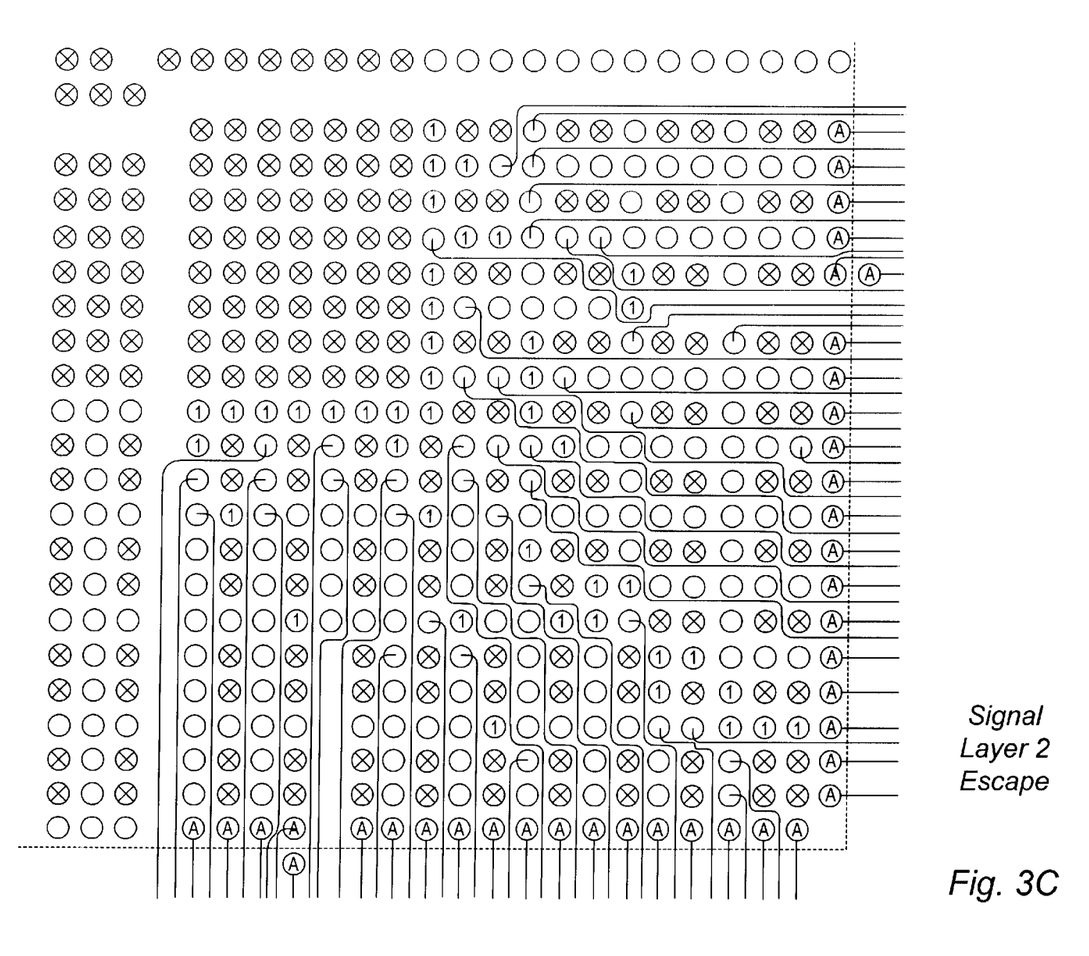
FIG. 3C is an illustration of a portion of one embodiment of signal pin assignments based on a 2×3 grid, which illustrates escape paths for the routing of signal lines on a second PCB layer.
Figure 3D:
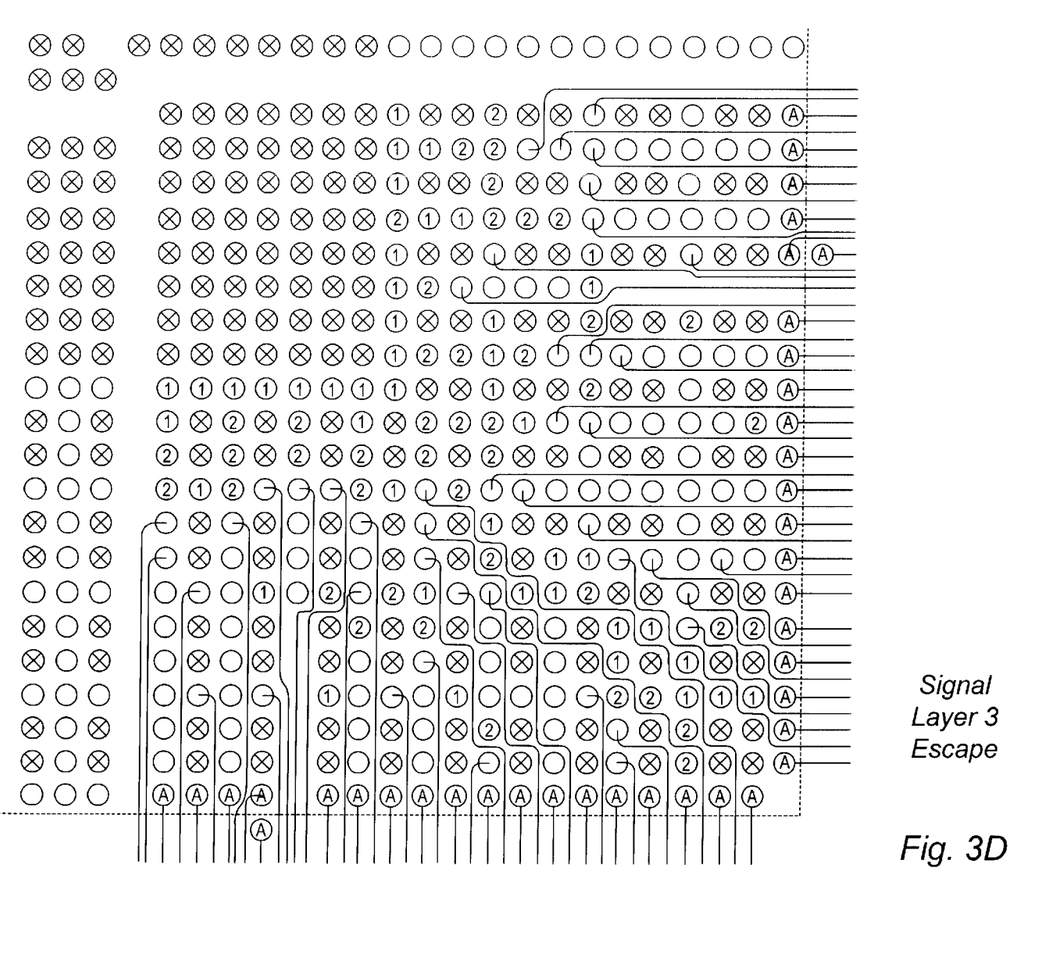
FIG. 3D is an illustration of a portion of one embodiment of signal pin assignment based on a 2×3 grid, which illustrates escape paths for the routing of signal lines on a third PCB layer.
Figure 3E:
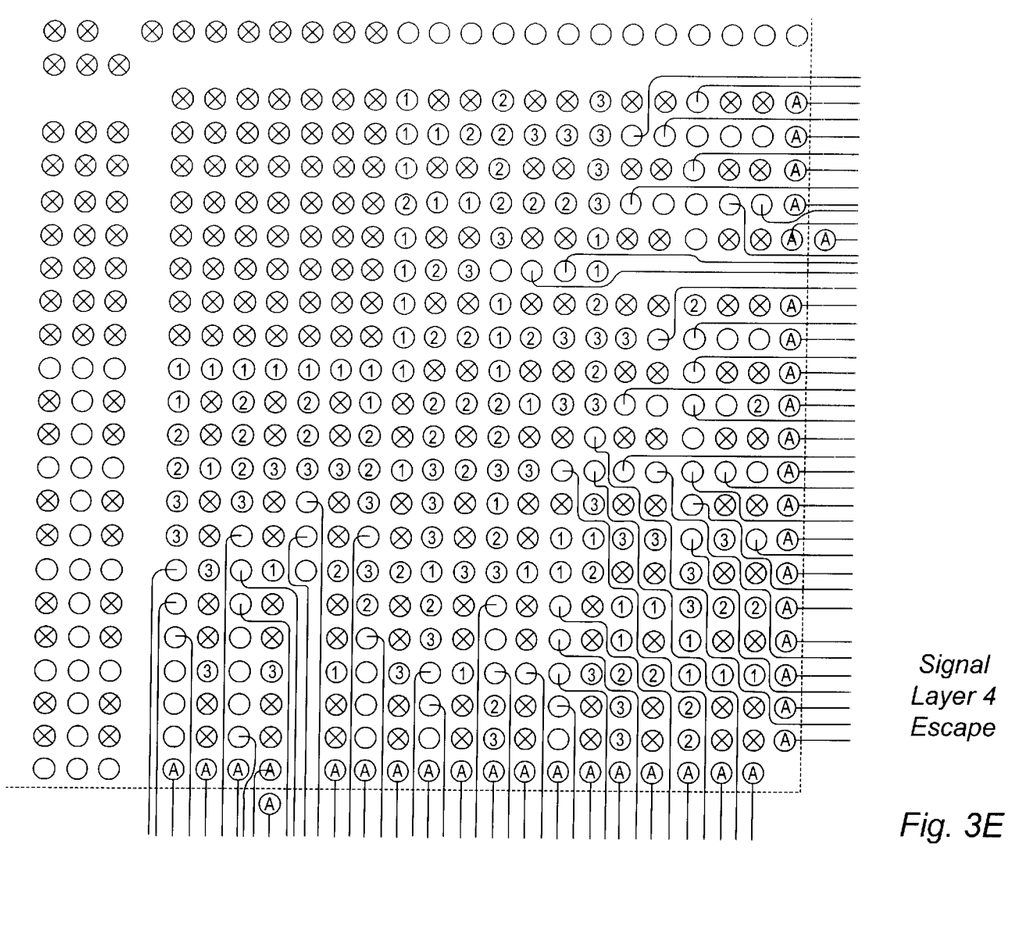
FIG. 3E is an illustration of a portion of one embodiment of signal pin assignments based on a 2×3 grid, which illustrates escape paths for the routing of signal lines on a fourth PCB layer.
Figure 3F:
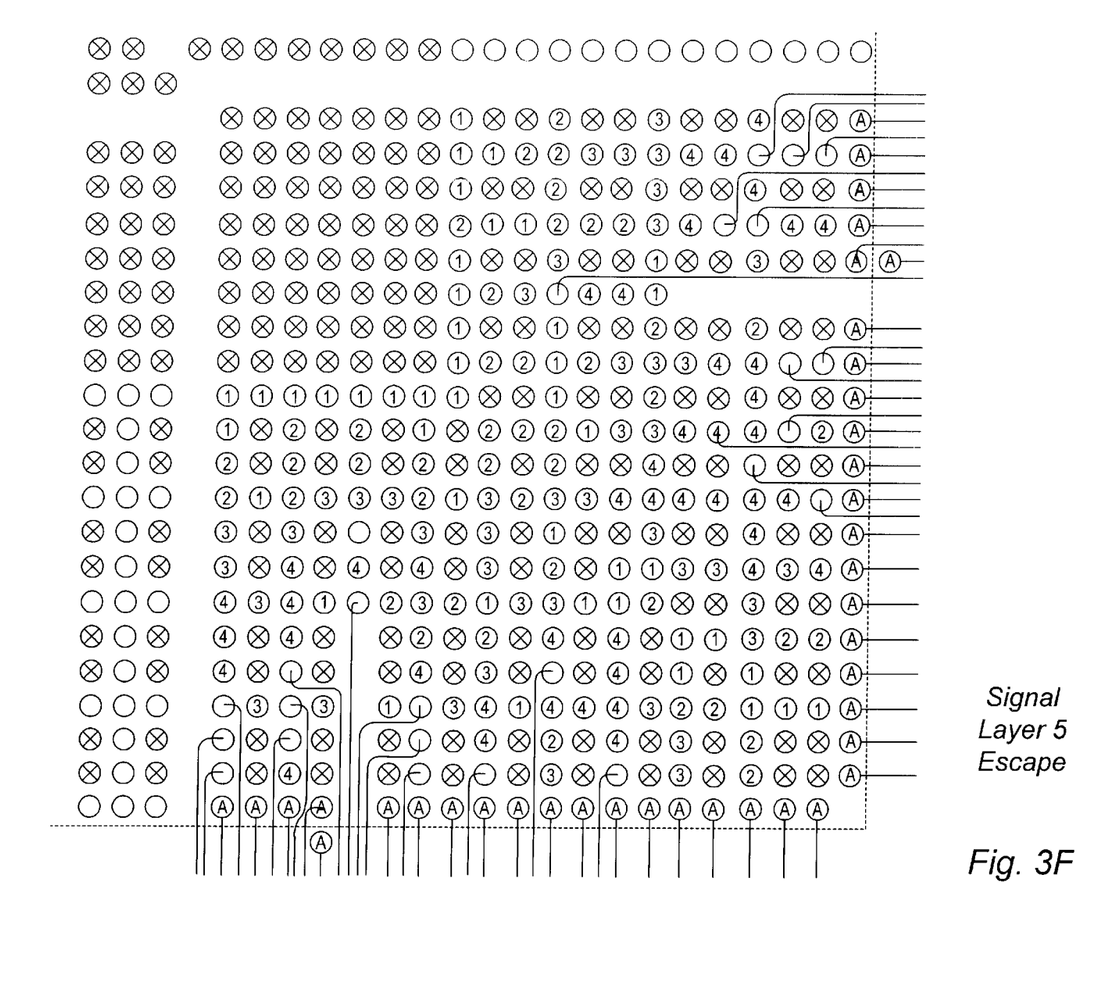
FIG. 3F is an illustration of a portion of one embodiment of signal pin assignments based on a 2×3 grid, which illustrates escape paths for the routing of signal lines on a fifth PCB layer.

FIG. 3C illustrates signal routing to signal connections for a second PCB layer. Those connections designated '1' are those in which a corresponding signal line was routed on the first PCB layer. FIG. 3D illustrates signal routing to signal connections for a third PCB layer, using a '1' and a '2' to designate those pins having corresponding signal routings on the first and second layers, respectively. FIG. 3E illustrates signal routing to signal connections for a fourth layer, and FIG. 3F illustrates signal routing to signal connections of a fifth PCB layer.

Figure 4A:
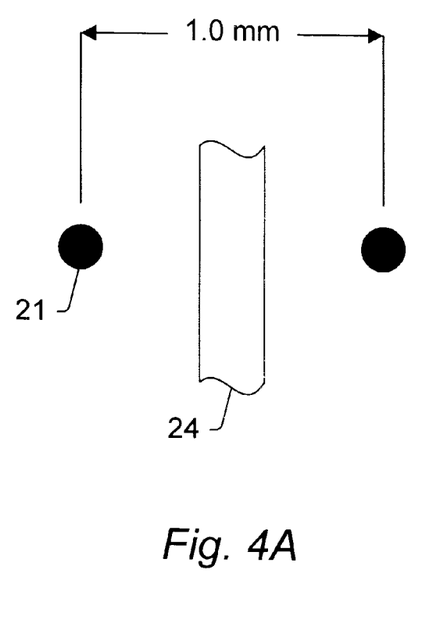
FIG. 4A is a drawing illustrating one embodiment of a set of PCB design rules.

FIG. 4A is a drawing illustrating one embodiment of a set of PCB design rules that may be used with the current method. In FIG. 4A, pads 21 are located on a PCB to which a semiconductor package is to be mounted. In the embodiment shown, pads 21 have a diameter of 25 mils (0.641 mm). It should be noted that the pads may have other shapes, such as a square shape or a diamond shape. In such cases, the maximum dimension traversing through the center of the pad is 25 mils, as with the round pads shown in the drawing. Both pads 21, and the package connections (e.g. the solder balls of a BGA) have a 1.0 mm pitch, meaning a distance of 1.0 mm exists between the centers of the pads. A single signal 24 having a width of 5 mils (0.1282 mm) is arranged between the pads. The design rules call for a minimum distance of 4.5 mils (0.115 mm) between signal line 24 and pads 21.

Figure 4B:
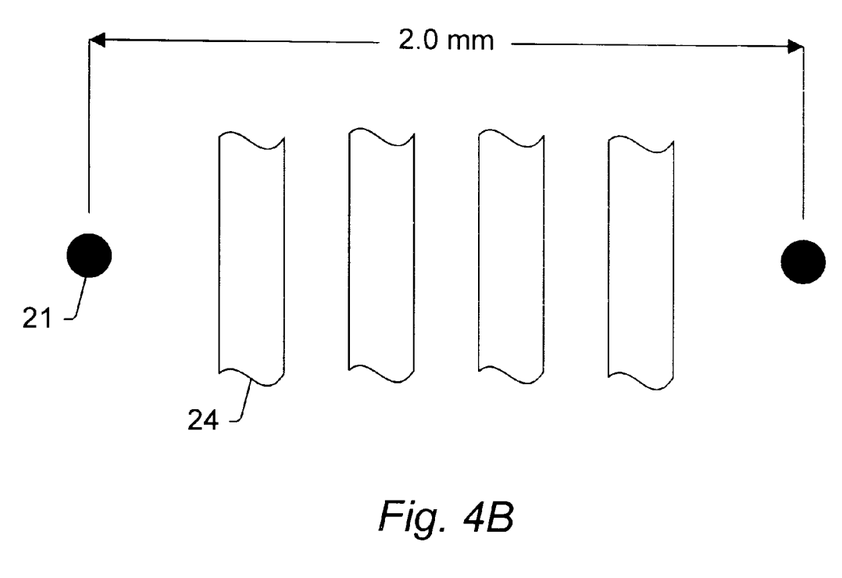

It should be noted that neither FIG. 4A, nor FIG. 4B, is drawn to scale.

FIG. 4B is a drawing illustrating another embodiment of a set of PCB design rules. In this particular embodiment, a distance of 2.0 mm exists between signal pads 21. Four signal lines 24 are arranged between signal pads 21, which also have a diameter of 25 mils, as those in illustrated in FIG. 4A. Similarly, the line width of signal lines 24 is 5 mils. The design rules also call for a minimum distance of 8 mils (0.205 mm) between each signal line 24, and a minimum distance of 5 mils between each signal line.

Both sets of design rules may be employed in a given design based on the method involving the 2×3 connection grids. In the example illustrated in FIGS. 3A–3F, the design rules explained in reference to FIG. 4A are used throughout most of the plurality of connections, as only a single signal line is routed between those connections separated by only 1.0 mm. In those areas where a large number of no-connects are present, the design rules explained in reference to FIG. 4B are used, as up to four signal lines may be routed between those connections separated by a distance of 2.0 mm.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method for assigning pins on a semiconductor package, the semiconductor package having an integrated circuit with power connections, ground connections, and signal connections, the method comprising:
arranging a plurality of M×N connection grids to form a plurality of connections, wherein each of the M×N connection grids is an arrangement of pins including a power connection and a ground connection adjacent to the power connection, wherein each connection at a periphery of the plurality of connections is a signal connection, and wherein no more than four signal connections are present for each power connection and each ground connection.

2. The method as recited in claim 1, wherein the semiconductor package is configured to be mounted onto a printed circuit board (PCB), wherein the PCB includes a plurality of pads for connecting the pins of the semiconductor package and a plurality of signal lines for conveying signals to and from the semiconductor package.

3. The method as recited in claim 2, wherein the PCB includes a plurality of layers, and wherein vias are used to connect signal lines from a surface layer to one of a plurality of inner layers.

4. The method as recited in claim 3, wherein the plurality of inner layers includes a power plane and a ground plane, wherein vias used for connecting a power connection to the power plane and a ground connection to the ground plane are not used for routing signal lines.

5. The method as recited in claim 2, wherein a distance of approximately 1.0 mm exists between the centers of two adjacent connections.

6. The method as recited in claim 5, wherein:
each signal line is approximately 0.128 mm in width;
each of the plurality of pads has a width of approximately 0.641 mm; and
each signal line is spaced from each pad by a distance of at least 0.115 mm.

7. The method as recited in claim 2, wherein a distance of approximately 2.0 mm exists between the centers of two adjacent connections.

8. The method as recited in claim 7, wherein:
each signal line is approximately 0.128 mm in width;
a space of at least 0.205 mm exists between each signal line;
each of the plurality of pads has a width of approximately 0.641 mm; and
each signal line is spaced from each pad by a distance of at least 0.128 mm.

9. The method as recited in claim 1, wherein each M×N connection grid includes at least one signal connection.

10. The method as recited in claim 1, wherein each M×N connection grid includes at least one pin that is not a power connection, a ground connection, or a signal connection.

11. The method as recited in claim 1, wherein the M×N connection grid is a 2×3 connection grid.

12. An electronic circuit comprising:
a printed circuit board (PCB);
a semiconductor package mounted to the printed circuit board, the semiconductor package including an integrated circuit coupled to power connections, ground connections, and signal connections, wherein the semiconductor package includes a plurality of connections arranged in M×N connection grids, wherein each M×N connection grid includes a power connection and a ground connection adjacent to the power connection, wherein each connection at a periphery of the plurality of connections is a signal connection, and wherein no more than four signal connections are present for each power connection and each ground connection.

13. The electronic circuit as recited in claim 12, wherein the PCB includes a plurality of pads for connecting the pins of the semiconductor package to the PCB, and a plurality of signal lines for conveying signals to and from the PCB.

14. The electronic circuit as recited in claim 13, wherein the PCB includes a plurality of layers, and wherein vias are used to connect signal lines from a surface layer to one of a plurality of inner layers.

15. The electronic circuit as recited in claim 14, wherein the plurality of inner layers includes a power plane and a ground plane, and wherein vias used for connecting a power connection to the power plane and a ground connection to the ground plane are not used for routing signal lines.

16. The electronic circuit as recited in claim 13, wherein a distance of approximately 1.0 mm exists between the centers of two adjacent connections.

17. The electronic circuit as recited in claim 16, wherein:
each signal line is approximately 0.128 mm in width;
each of the plurality of pads has a width of approximately 0.641 mm; and
each signal line is spaced from each pad by a distance of at least 0.115 mm.

18. The electronic circuit as recited in claim 13, wherein a distance of approximately 2.0 mm exists between the centers of two adjacent connections.

19. The electronic circuit as recited in claim 12, wherein each M×N connection grid includes at least one signal connection.

20. The electronic circuit as recited in claim 12, wherein at least one of the M×N connection grids includes at least one pin that is not a power connection, a ground connection, or a signal connection.

21. The electronic circuit as recited in claim 20, wherein:
each signal line is approximately 0.128 mm in width;
a space of at least 0.205 mm exists between each signal line;
each of the plurality of pads has a width of approximately 0.641 mm; and
each signal line is spaced from each pad by a distance of at least 0.128 mm.

22. The electronic circuit as recited in claim 12, wherein the M×N connection grid is a 2×3 connection grid.

23. An integrated circuit package comprising:
a plurality of connections arranged in M×N connection grids, wherein each M×N connection grid includes a power connection and a ground connection adjacent to the power connection, wherein each connection at a periphery of the plurality of connections is a signal connection, and wherein no more than four signal connections are present for each power connection and each ground connection.

24. The integrated circuit package as recited in claim 23, wherein the integrated circuit package is configured for mounting to a PCB, wherein each of the plurality of connections of the integrated circuit package are pins, and wherein the PCB includes a plurality of pads for connecting the pins of the integrated circuit package to the PCB, and a plurality of signal lines for conveying signals to and from the PCB.

25. The integrated circuit as recited in claim 23, wherein each M×N connection grid includes at least one signal connection.

26. The integrated circuit as recited in claim 23, wherein at least one of the M×N connection grids includes at least one connection that is not a power connection, a ground connection, or a signal connection.

27. The integrated circuit as recited in claim 23, wherein the M×N connection grids are 2×3 connection grids.

* * * * *